United States Patent
Watanabe

(10) Patent No.: US 10,109,482 B2
(45) Date of Patent: Oct. 23, 2018

(54) METHOD FOR TREATING SURFACE OF SEMICONDUCTOR LAYER, SEMICONDUCTOR SUBSTRATE, METHOD FOR MAKING EPITAXIAL SUBSTRATE

(71) Applicant: SUMITOMO ELECTRIC DEVICE INNOVATIONS, INC., Yokohama-shi (JP)

(72) Inventor: Tadashi Watanabe, Yokohama (JP)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 9 days.

(21) Appl. No.: 15/616,562

(22) Filed: Jun. 7, 2017

(65) Prior Publication Data
US 2017/0278702 A1    Sep. 28, 2017

Related U.S. Application Data

(62) Division of application No. 14/577,847, filed on Dec. 19, 2014, now abandoned.

(30) Foreign Application Priority Data

Dec. 20, 2013 (JP) ................................ 2013-264346

(51) Int. Cl.
| | |
|---|---|
| *H01L 21/02* | (2006.01) |
| *C23C 16/44* | (2006.01) |

(Continued)

(52) U.S. Cl.
CPC ........ *H01L 21/0254* (2013.01); *C23C 16/303* (2013.01); *C23C 16/4401* (2013.01);
(Continued)

(58) Field of Classification Search
CPC ........... H01L 21/0254; H01L 21/02458; H01L 21/02505; H01L 21/0262; H01L 21/02664;
(Continued)

(56) References Cited

U.S. PATENT DOCUMENTS

2002/0013042 A1* 1/2002 Morkoc ................. B82Y 10/00
                                                              438/604
2005/0239271 A1* 10/2005 Sakakibara ............. C30B 25/02
                                                              438/483

(Continued)

FOREIGN PATENT DOCUMENTS

| EP | 1679740 A1 | 7/2006 |
|---|---|---|
| JP | H08-064866 A | 3/1996 |

(Continued)

*Primary Examiner* — Didarul Mazumder
(74) *Attorney, Agent, or Firm* — Venable LLP; Michael A. Sartori; Kerri M. Patterson

(57) ABSTRACT

A surface treatment method for a semiconductor layer includes growing a first layer on a substrate in a growth reactor, the first layer consisting of one of gallium nitride, aluminum gallium nitride and indium aluminum nitride; growing a second layer of gallium nitride on a surface of the first layer, the gallium nitride of the second GaN layer having a composition ratio of gallium to nitrogen larger than 2; taking the substrate out of the growth reactor after growing the second layer; and removing the second layer after taking the substrate out of the growth reactor.

4 Claims, 14 Drawing Sheets

(51) Int. Cl.
*C23C 16/56* (2006.01)
*H01L 21/30* (2006.01)
*H01L 29/20* (2006.01)
*H01L 21/306* (2006.01)
*H01L 29/778* (2006.01)
*C23C 16/30* (2006.01)

(52) U.S. Cl.
CPC .......... *C23C 16/56* (2013.01); *H01L 21/0262* (2013.01); *H01L 21/02458* (2013.01); *H01L 21/02505* (2013.01); *H01L 21/02664* (2013.01); *H01L 21/30612* (2013.01); *H01L 29/7786* (2013.01); *H01L 29/2003* (2013.01)

(58) Field of Classification Search
CPC ........... H01L 21/30612; H01L 29/7786; H01L 29/2003; C23C 16/303; C23C 16/4401; C23C 16/56
USPC ................................. 257/192; 438/285, 590
See application file for complete search history.

(56) References Cited

U.S. PATENT DOCUMENTS

| | | | | |
|---|---|---|---|---|
| 2006/0174815 A1* | 8/2006 | Butcher | ................ | C01G 15/00 117/2 |
| 2006/0289860 A1* | 12/2006 | Ichinose | ................ | C30B 25/02 257/43 |
| 2007/0018284 A1 | 1/2007 | Nakayama et al. | | |
| 2007/0082465 A1* | 4/2007 | Song | ..................... | C30B 25/183 438/478 |
| 2009/0117675 A1* | 5/2009 | Yamanaka | ............... | C23C 16/01 438/22 |
| 2011/0204377 A1* | 8/2011 | Park | ....................... | C30B 25/183 257/76 |
| 2011/0220965 A1* | 9/2011 | Ohki | ................ | H01L 21/28264 257/194 |
| 2011/0272703 A1* | 11/2011 | Lee | ....................... | H01L 33/007 257/76 |
| 2012/0135549 A1 | 5/2012 | Nakayama et al. | | |
| 2013/0255565 A1* | 10/2013 | Wei | ..................... | H01L 21/0237 117/58 |

FOREIGN PATENT DOCUMENTS

| | | |
|---|---|---|
| JP | 2003-068660 A | 3/2003 |
| JP | 2003-069075 A | 3/2003 |
| JP | 2004-335732 A | 11/2004 |
| JP | 2006-114802 A | 4/2006 |
| JP | 2006-190973 A | 7/2006 |
| JP | 2010-016191 A | 1/2010 |
| JP | 2010-177233 A | 8/2010 |
| JP | 2011-035064 A | 2/2011 |
| JP | 2013-046063 A | 3/2013 |
| WO | 2005/041283 A1 | 5/2005 |

* cited by examiner

METHOD FOR TREATING SURFACE OF SEMICONDUCTOR LAYER, SEMICONDUCTOR SUBSTRATE, METHOD FOR MAKING EPITAXIAL SUBSTRATE

CROSS-REFERENCE TO RELATED APPLICATIONS

This application is a Divisional of U.S. patent application Ser. No. 14/577,847, filed Dec. 19, 2014, which claims the benefit of Japanese Patent Application No. 2013-264346, filed Dec. 20, 2013.

BACKGROUND OF THE INVENTION

Field of the Invention

The present invention relates to a method for treating the surface of a semiconductor layer, a semiconductor substrate, and a method for making an epitaxial substrate, in particular to a method for treating a surface of a semiconductor layer including a nitride semiconductor layer, a semiconductor substrate including a nitride semiconductor layer, and a method for making an epitaxial substrate including a nitride semiconductor layer.

Related Background Art

A semiconductor device including a nitride semiconductor is applied to, for example, a power device which operates at a high frequency and a high power. A high electron mobility transistor (HEMT) is known as the semiconductor device that includes the nitride semiconductor. The HEMT includes an electron transit layer and an electron supply layer.

Japanese Patent Application Laid-open No. 2011-3677 discloses that foreign particles adhere onto an epitaxial wafer.

SUMMARY OF THE INVENTION

In the growth of a nitride semiconductor layer including gallium (Ga), particles containing Ga, such as droplets, sometimes adhere onto the nitride semiconductor layer to form accreting objects. When the nitride semiconductor layer is grown to form a semiconductor device, the following defects may be caused by the droplets: an electric short-circuit is caused in the semiconductor device; breaking of wires is caused in the semiconductor device; and unevenness of an applied resist in thickness is caused in a fabrication process for the semiconductor device. These defects result in the reduction in yield of the semiconductor device.

Some aspects of the present invention have an object to provide a semiconductor substrate and a method for reducing particles, which comprises gallium, adhering onto a semiconductor layer, and a method for making an epitaxial substrate having the reduced number of particles comprising gallium thereon.

A surface treatment method for a semiconductor layer according to one aspect of the present invention includes the steps of: growing a first layer on a substrate in a growth reactor, the first layer consisting of one of gallium nitride, aluminum gallium nitride and indium aluminium nitride; growing a second layer of gallium nitride on a surface of the first layer, the gallium nitride of the second GaN layer having a composition ratio of gallium to nitrogen larger than 2; taking the substrate out of the growth reactor after growing the second layer; and removing the second layer after taking the substrate out of the growth reactor.

A semiconductor substrate according to another aspect of the present invention includes: a first layer consisting of one of gallium nitride, aluminum gallium nitride and indium aluminium nitride; and a second layer of gallium nitride having a composition ratio of gallium to nitrogen larger than 2, the second layer being provided on the first layer.

Still another aspect of the present invention relates to a method of making an epitaxial substrate. The method comprises the steps of: growing a first layer on a substrate in a growth reactor, the first layer consisting of one of gallium nitride, aluminum gallium nitride and indium aluminium nitride; growing a second layer of gallium nitride compound on the first layer in the growth reactor, the first layer being in contact with the second layer, and the gallium nitride compound having a composition ratio of gallium to nitrogen larger than 2; taking the substrate out of the growth reactor after growing the second layer; and etching the second layer to expose the first layer after taking the substrate from the growth reactor.

BRIEF DESCRIPTION OF THE DRAWINGS

The object and other objects, features, and advantages of the present invention will be more easily clarified from the following detailed description of a preferred embodiment of the present invention, which proceeds with reference to the accompanying drawings.

DESCRIPTION OF THE PREFERRED EMBODIMENTS

Figure 1:
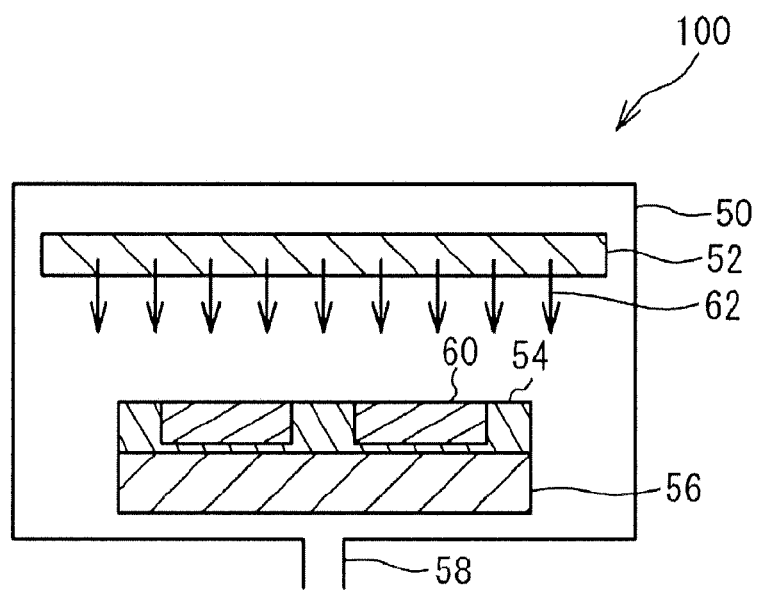
FIG. 1 is a view showing a method of growing a semiconductor layer on a substrate.

First, embodiments according to some aspect of the present invention will be explained below.

One aspect of the present embodiments is a surface treatment method for a semiconductor layer, which comprises the steps of: growing a first layer on a substrate in a growth reactor, the first layer consisting of one of gallium nitride, aluminum gallium nitride and indium aluminium nitride; growing a second layer of gallium nitride on a surface of the first layer, the gallium nitride of the second GaN layer having a composition ratio of gallium to nitrogen larger than 2; taking the substrate out of the growth reactor after growing the second layer; and removing the second layer after taking the substrate out of the growth reactor. In the method according to the one aspect, growing a second layer on a surface of the first layer includes a step of forming the second layer on the first layer using an MOCVD reactor at a substrate temperature equal to or lower than 800 degrees Celsius. In the method according to the one aspect, removing the second layer includes removing the second layer using mixed liquid including sulfuric acid and hydrogen peroxide. In the method according to the one aspect, the growth reactor includes an introducing port for introducing gas above the substrate. In the method according to the one aspect, an accreting object are formed on the second layer after growing the second layer, and the accreting object is removed in the step of removing the second layer. In the method according to the one aspect, the first layer and the second layer are continuously grown in the growth reactor.

Another aspect of the present embodiments relates to a semiconductor substrate comprising: a first layer consisting of one of gallium nitride, aluminum gallium nitride and indium aluminium nitride; and a second layer of gallium nitride having a composition ratio of gallium to nitrogen larger than 2, the second layer being provided on the first layer. In the semiconductor substrate according to the another aspect, the semiconductor substrate further comprises particles containing gallium, the particles being provided on the second layer. In the semiconductor substrate according to the another aspect, a film thickness of the second layer is equal to or larger than 100 nm. In the semiconductor substrate according to the another aspect, the second layer is formed to be in contact with the first layer.

Still another aspect of the present embodiments is a method for making an epitaxial substrate, which comprises the steps of: growing a first layer on a substrate in a growth reactor, the first layer consisting of one of gallium nitride, aluminum gallium nitride and indium aluminium nitride; growing a second layer of gallium nitride compound on the first layer in the growth reactor, the first layer being in contact with the second layer, and the gallium nitride compound having a composition ratio of gallium to nitrogen larger than 2; taking the substrate out of the growth reactor after growing the second layer; and etching the second layer to expose the first layer after taking the substrate from the growth reactor. In the method according to the above aspect, growing a second layer on a surface of the first layer includes a step of forming the second layer on the first layer using an MOCVD reactor at a substrate temperature equal to or lower than 800 degrees Celsius. In the method according to the above aspect, removing the second layer includes removing the second layer using mixed liquid including sulfuric acid and hydrogen peroxide. In the method according to the above aspect, the growth reactor includes an introducing port for introducing gas above the substrate. In the method according to the above aspect, an accreting object are formed on the second layer after growing the second layer, and the accreting object is etched in the step of etching the second layer.

One aspect of the present embodiments is a surface treatment method for a semiconductor layer including: forming a first GaN layer of gallium nitride on a substrate in a growth reactor; forming a second GaN layer of gallium nitride on the surface of the first GaN layer, the gallium nitride of the second GaN layer having a composition ratio of gallium to nitrogen larger than 2; taking the substrate out of the growth reactor after forming the second GaN layer; and removing the second GaN layer after taking the substrate out of the growth reactor. The second GaN layer of gallium nitride having the composition ratio of gallium to nitrogen larger than 2 is grown on the first GaN layer to form an epitaxial substrate, and the epitaxial substrate is taken out of the growth reactor and the second GaN layer is removed from the epitaxial substrate. The removal of the second GaN layer allows accreting objects or particles containing gallium from disappearing along with the second GaN layer.

It is preferable that forming a second GaN layer of gallium nitride include forming the second GaN layer on the first GaN layer at a substrate temperature equal to or lower than 800 degrees Celsius in an MOCVD reactor. This temperature range allows the gallium nitride of the second GaN layer to have the composition ratio of gallium to nitrogen larger than 2.

It is preferable that mixed liquid including sulfuric acid and hydrogen peroxide be used in the step of removing the second GaN layer. Consequently, the second GaN layer together with fallen objects or gallium-containing particles thereon can be removed.

The growth reactor may include an introducing port for introducing gas located above the substrate. This method allows for the reduction in the number of the fallen objects even in the above growth reactor, which may create the fallen objects.

It is preferable that, after forming the second GaN layer, the fallen objects be formed on the second GaN layer and that the fallen objects be removed in the step of removing the second GaN layer. This method allows for the reduction in the number of fallen objects remaining thereon.

It is preferable that, in the growth reactor, the first GaN layer and the second GaN layer be continuously formed.

Another aspect of the present embodiments relates to a semiconductor substrate including: a first GaN layer of gallium nitride; and a second GaN layer formed on the first GaN layer, gallium nitride of the first GaN layer having a composition ratio of gallium to nitrogen larger than 2. According to the present invention, removing the second GaN layer can remove particles containing gallium thereon.

It is preferable that the semiconductor device include particles containing gallium fallen on the second GaN layer.

It is preferable that a film thickness of the second GaN layer be equal to or larger than 100 nm.

Details explanation of embodiments of the present invention will be made below. Specific examples of a semiconductor device, the method for fabricating the semiconductor device, and a semiconductor substrate according to the embodiments of the present invention are explained below with reference to the drawings. Note that the present invention is not limited to the specific examples. It is intended that all changes within meanings and scopes indicated by the claims and their equivalents are included.

Figure 2:
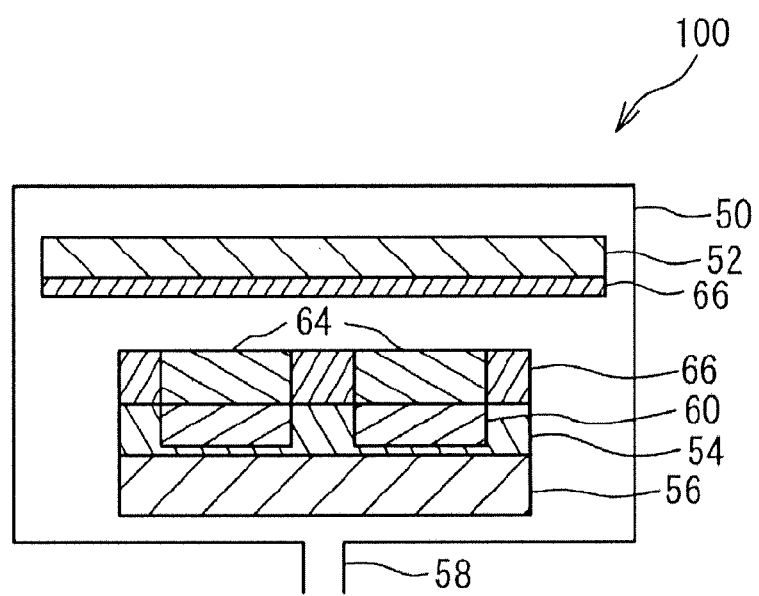
FIG. 2 is a view showing the method of growing the semiconductor layer on the substrate.
Figure 3:
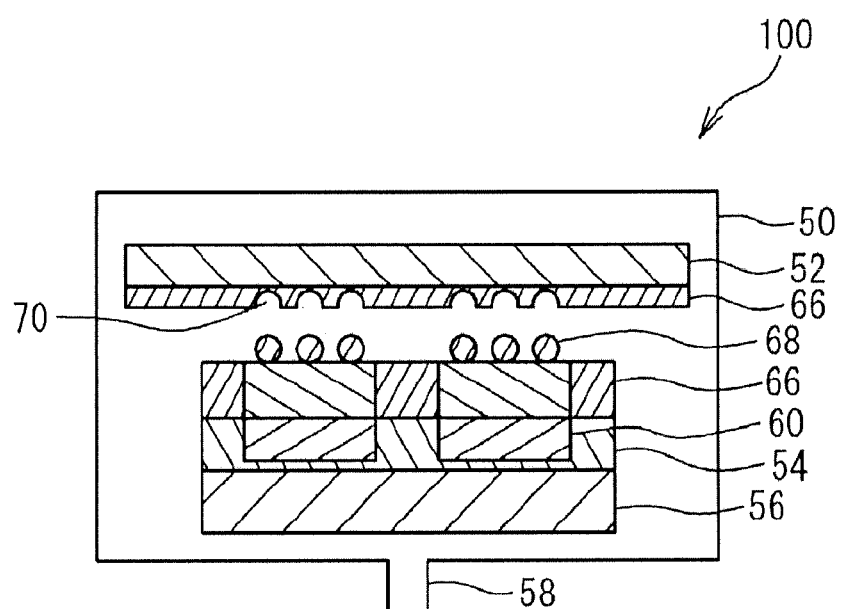
FIG. 3 is a view showing the method of growing the semiconductor layer on the substrate.

First, explanation on droplets (fallen objects: metal objects that peel from a gas introducing section (e.g., a showerhead) or the sidewall (e.g., a susceptor sidewall) of a growth reactor to adhere to a substrate surface) are made. FIGS. 1 to 3 are schematic diagrams each showing a method of forming a semiconductor layer on a substrate. As shown in FIG. 1, a metal organic chemical vapor deposition (MOCVD) apparatus can be used as a growth reactor 100, which includes a chamber 50, an introducing section 52, a susceptor 54, a heater 56, and an exhaust section 58. The chamber 50 can hold a wafer 60 in an atmosphere of a raw material gas 62. The introducing section 52 includes, for example, a showerhead, and can introduce the material gas 62 into the chamber 50. The introducing section 52 is provided to supply the material gas 62 to the surface of the wafer 60. The material gas 62 from the introducing section 52 is uniformly supplied to the surface of the wafer 60 to allow the entire surface of a semiconductor layer grown on the wafer 60 to have a good uniformity in thickness. The susceptor 54 holds one or plural wafers 60. The heater 56 heats the wafers 60 through the susceptor 54. The exhaust section 58 exhausts the material gas 62 in the chamber 50 and operates to keep the pressure in the chamber 50 constant.

In this embodiment, the growth reactor 100 has, for example, a face-up type structure. The material gas 62 flows downward from above the wafer 60 to the surface of the wafer 60 to reach the wafer 60 in a down-flow manner. The material gas 62 around the wafer 60 is decomposed by thermal energy that the heater 56 generates, so that the decomposed material deposits on the wafer 60 to grow a semiconductor layer on the wafer 60.

As shown in FIG. 2, a semiconductor layer 64 is formed on the wafer 60. The semiconductor layer 64 is made of single crystal and, in this example, is constituted by a nitride semiconductor layer. The susceptor 54 is heated by the heater 56 to decompose the material gas 62 near the susceptor 54. An amorphous or polycrystalline semiconductor layer 66 is created and adheres onto the susceptor 54. Further, the introducing section 52 is also heated by heat radiation from the susceptor 54, and the material gas 62 is also decomposed near the introducing section 52, so that the amorphous or polycrystalline semiconductor layer 66 also deposits on the lower surface of the introducing section 52. When the semiconductor layer 64 is grown to form a semiconductor layer including GaN, the semiconductor layer 66 is also grown such that a Ga composition ratio of the semiconductor layer 66 is higher than a Ga composition ratio of the semiconductor layer 64.

When a flow of gas changes in the chamber 50, as shown in FIG. 3, one or more parts of the semiconductor layer 66 adhering to the underside of the introducing section 52 are detached therefrom and drop onto the semiconductor layer 64. Consequently, droplets 68 are formed on the semiconductor layer 64. The change in the flow of the gas is caused in the chamber 50, for example, by the switching of the material gas 62, its stop, its introduction, or the like.

In a growth reactor of a face-up type, as shown in FIGS. 1 to 3, in which the introducing section 52 is located above the wafer 60, pieces of the semiconductor layer 66 that adheres to the introducing section 52 may fall with the force of gravity to reach the semiconductor layer 64. In a growth reactor in which the introducing section 52 is not located above the wafer 60, the semiconductor layer 66 also deposits on the ceiling of the chamber 50, which is located above the wafer 60. In the above configuration, the droplets 68 are also formed on the semiconductor layer 64. Further, in a growth reactor different from that of the face-up type, the droplets 68 from the semiconductor layer 66 also sometimes adhere onto the semiconductor layer 64.

Figure 4:
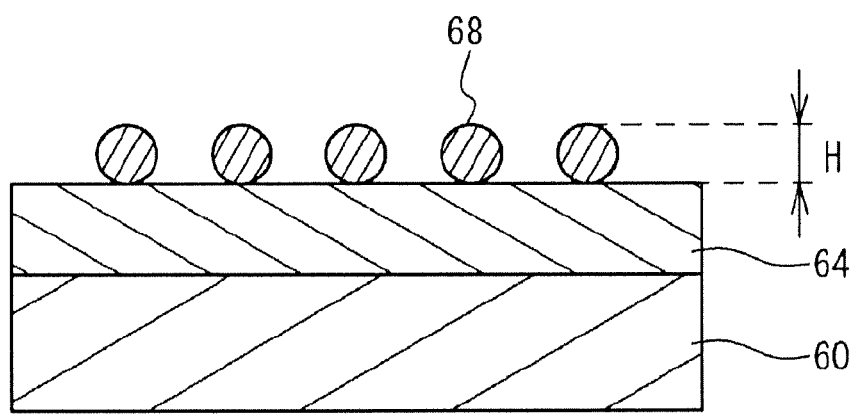
FIG. 4 is a sectional view showing a semiconductor substrate on which droplets are located.

FIG. 4 is a schematic cross sectional view showing a semiconductor substrate to which the droplets have adhered. As shown in FIG. 4, the semiconductor layer 64 is formed on the wafer 60, and the droplets 68 adhere onto the semiconductor layer 64. Some of the droplets 68 have height H equal to or larger than, for example, 100 μm. Therefore, the droplets located across conductive layers of the semiconductor device are likely to form an undesired electric short-circuit in the semiconductor device, thereby resulting in a cause of defective products. The droplets are likely to cause breaking of wire in the semiconductor devices. Further, a photo resist is applied to the wafer 60 with droplets in a manufacturing process for the semiconductor device, and the droplets cause unevenness in thickness of the applied resist. As seen from the above examples, the droplets reduce the yield of the semiconductor device.

Figure 5:
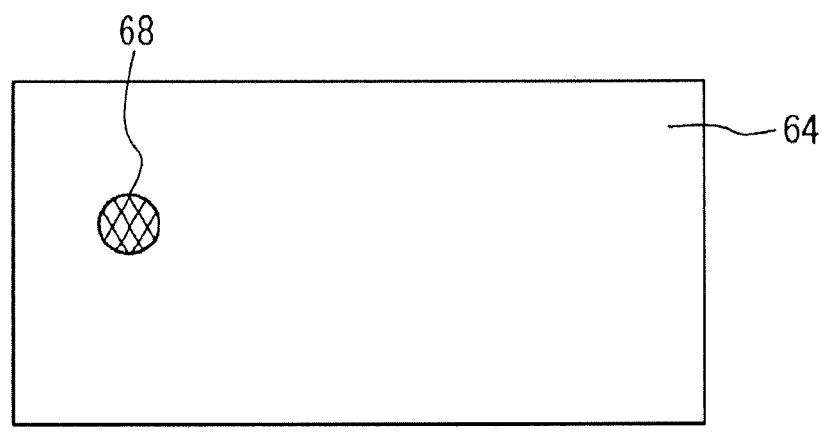
FIG. 5 is a schematic view of an optical microscope image of the droplet.

FIG. 5 is a schematic view showing an image of the droplet obtained by an optical microscope. Referring to FIG. 5, the droplet 68 is drawn to have a substantially spherical shape on the semiconductor layer 64. The droplets 68 on the surface of the wafer 60 or semiconductor pieces peeling from the semiconductor layer 66 are not spherical in most cases. The semiconductor pieces adhering onto the semiconductor layer 64 are, however, deformed by heat from the heater 56. The droplets 68 become spherical to have the largest surface area according to surface tension. However, depending upon a substrate temperature after the adhesion of pieces onto the semiconductor layer 64, the droplets 68 may not have a spherical shape.

One of measures for preventing the droplets from being formed is a method of frequently cleaning the growth reactor, but this method decreases a throughput in the growth reactor. Another measure is a method of removing the droplets on the semiconductor layer 64 by blowing gas, but the droplets are not efficiently removed only by the blowing of the gas. This is because the droplets are bound with the semiconductor layer 64 through thermal reaction or intermolecular force.

Still another measure is a method of removing the droplets 68 by dry etching. This method may physically or chemically damage the semiconductor layer 64. Since the surface of the semiconductor layer 64 is exposed to plasma from the dry etching, it is likely to form an altered layer in the semiconductor layer 64.

A remaining measure is a method of removing the droplets 68 by wet etching, and the inventor examines the removal of the droplets 68 by wet etching.

A GaN electron transit layer, an AlGaN electron supply layer, and a GaN cap layer were grown on a substrate to form the monocrystalline semiconductor layer 64. In this growth, droplets were formed to adhere onto the semiconductor layer 64, and were analyzed using an energy dispersive X-ray spectroscopy (EDX) method.

Figure 6:
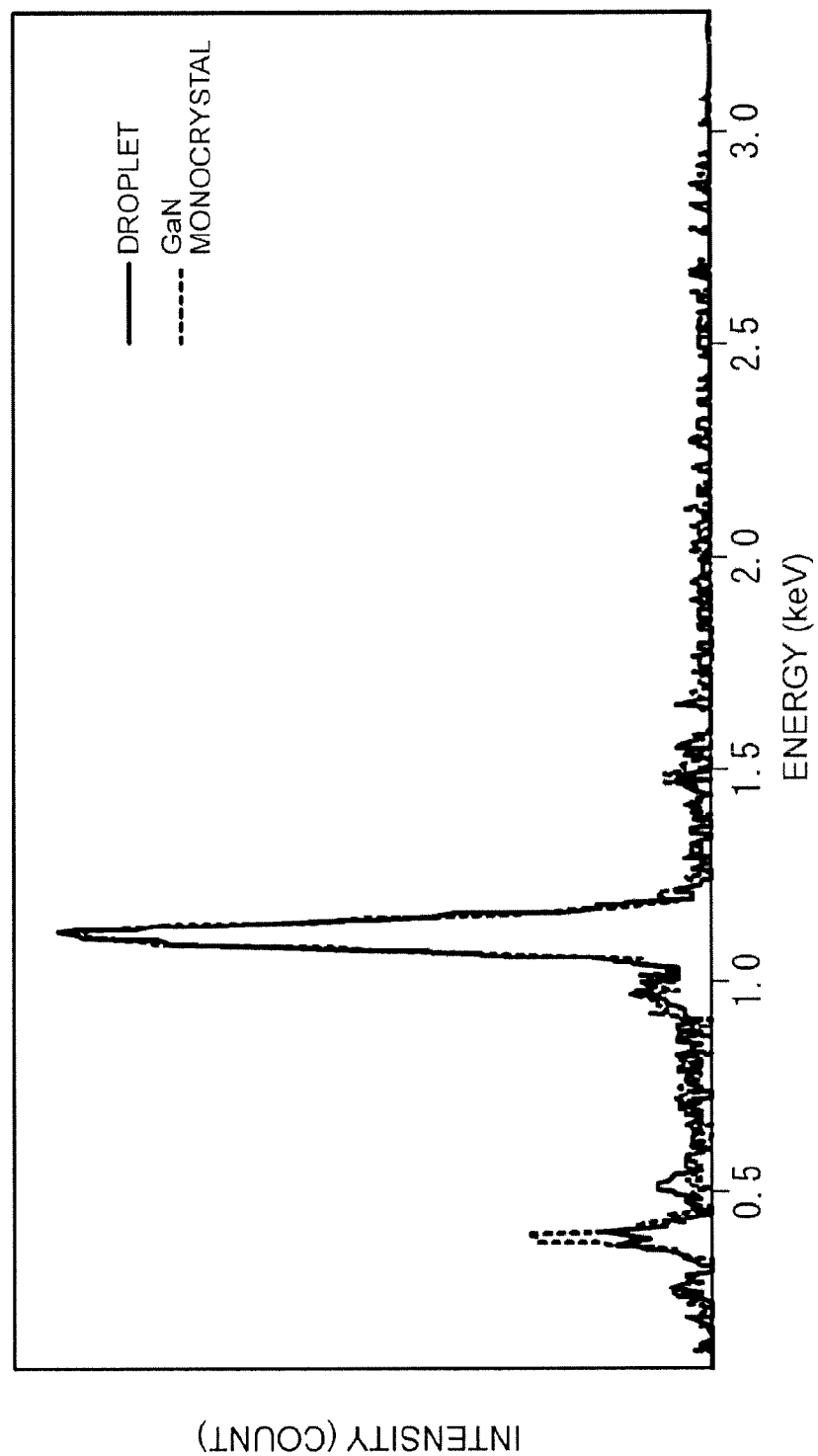
FIG. 6 is a view showing an EDX analysis result of the droplets.

FIG. 6 is a view showing an EDX analysis result of the droplets. The abscissa indicates energy and the ordinate indicates the number of counts, and the solid line in FIG. 6 represents an analysis result of the droplets and the broken line represents an analysis result of the monocrystalline GaN layer. In the EDX analysis, there is little difference in the peak intensity of gallium (Ga) around 1.1 keV between the droplets and the GaN layer. On the other hand, the peak intensity of nitrogen (N) around 0.4 keV is small in a signal from the droplets as compared with the GaN layer. The comparison between signal intensities from gallium near 1.1 keV and nitrogen near 0.4 keV shows that a composition ratio ([Ga]/[N]) of Ga and N in the droplets 68 is higher than the composition ratio in the monocrystalline GaN layer. The droplets 68 are particles with, for example, the amount of Ga being rich. For example, when the droplets 68 are a gallium nitride compound, a composition ratio of gallium to nitrogen is larger than two (i.e., the droplets 68 include a compound $Ga_{1+x}N$, where X>2). The composition ratio of gallium to nitrogen is sometimes larger than three, and is sometimes larger than four.

Ga can be wet-etched with mix liquid of sulfuric acid and hydrogen peroxide (sulfuric acid/hydrogen peroxide mixture), and the droplets on the GaN monocrystalline layer were immersed in this sulfuric acid/hydrogen peroxide mixture. This sulfuric acid/hydrogen peroxide mixture contains sulfuric acid (96 volume %) and hydrogen peroxide (30 volume %) at the ratio of (sulfuric acid)/(hydrogen peroxide)=5/1.

Figure 7:
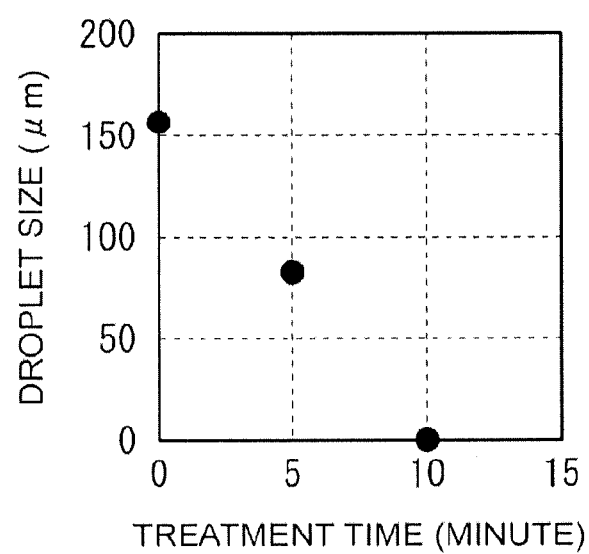
FIG. 7 is a view showing the relationship between the size of the droplets and the treatment time.
Figure 8:
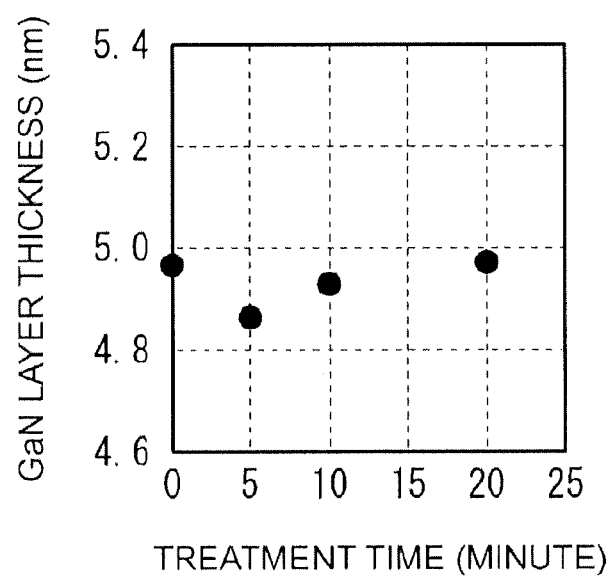
FIG. 8 is a view showing the relationship between a film thickness of a GaN layer and the treatment time.

FIG. 7 is a view showing a relation between the size of the droplets on the GaN monocrystalline layer and a treatment time during which the droplets were etched using the sulfuric acid/hydrogen peroxide mixture. FIG. 8 is a view showing a relation between the treatment time and the film thickness of the GaN layer. The treatment time is defined as the period of time during which the droplets were immersed in the sulfuric acid/hydrogen peroxide mixture. The droplet size is specified as the size of the droplets measured with a microscope. The film thickness of the GaN layer is specified as the film thickness of the GaN monocrystalline layer measured using an X-ray diffraction (XRD) method.

As shown in FIG. 7, the size of droplets as etched decreases as the treatment time increases. After the treatment time of 10 minutes, the droplet size becomes zero, which indicates that the droplets have been removed.

As shown in FIG. 8, the film thickness of the GaN layer hardly changes even after the treatment time of 20 minutes. This shows that the sulfuric acid/hydrogen peroxide mixture etches the droplets and does not etch the GaN monocrystalline layer. As shown in FIGS. 7 and 8, it is possible to remove the droplets with the sulfuric acid/hydrogen peroxide mixture without etching the GaN monocrystalline layer.

Figure 9:
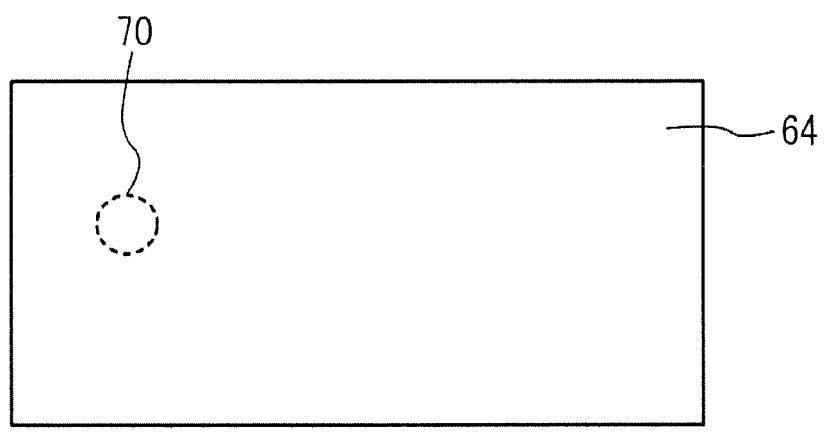
FIG. 9 is a schematic view showing an optical microscope image of a trace of a droplet.

The surface of the GaN layer from which the droplets were removed was observed using an optical microscope. A result is as explained below. FIG. 9 is a schematic view of an optical microscope image showing a trace of a droplet. As shown in FIG. 9, the observation reveals that a trace 70 is left on the surface of the semiconductor layer 64 and that the trace 70 has a concave shape with depth of, for example, about 100 nm. The trace 70 may cause a deficiency in the semiconductor device.

As seen from the above explanation, it is not easy to reduce the number of droplets. Examples of the present invention will be explained below with reference to the drawings.

EXAMPLE 1

Figure 10A:
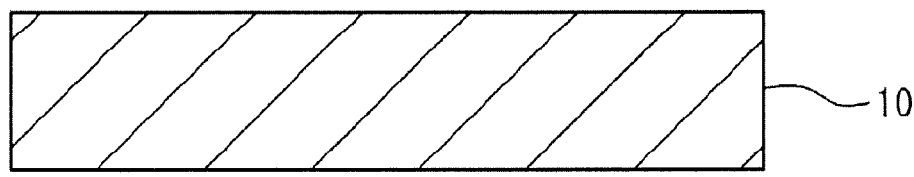
FIG. 10A is a sectional view showing a method of fabricating a semiconductor device according to Example 1.

FIGS. 10A to 11C are schematic cross sectional views showing the primary steps in a method of fabricating a semiconductor device according to an example 1. As shown in FIG. 10A, a substrate 10 is prepared, and the substrate 10 can be, for example, a silicon carbide (SiC) substrate. As the substrate 10, for example, a silicon (Si) substrate, a sapphire substrate, a GaN substrate, or a gallium oxide ($Ga_2O_3$) substrate can also be used.

Figure 10B:
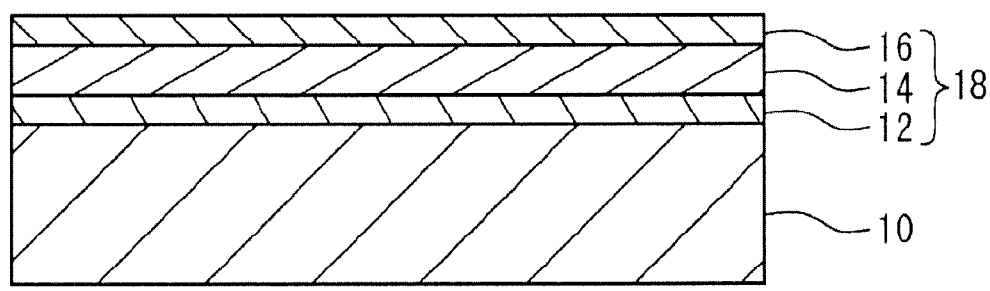
FIG. 10B is a sectional view showing the method of fabricating the semiconductor device according to Example 1.

As shown in FIG. 10B, a buffer layer 12, an electron transit layer 14, and an electron supply layer 16 are grown on the substrate 10 using the growth reactor 100 shown in FIG. 1, thereby forming a nitride semiconductor layer 18. In this embodiment, the buffer layer 12 can be, for example, an aluminum nitride (AlN) layer. The electron transit layer 14 can be, for example, a GaN layer. The electron supply layer 16 can be, for example, an AlGaN layer.

Figure 10C:
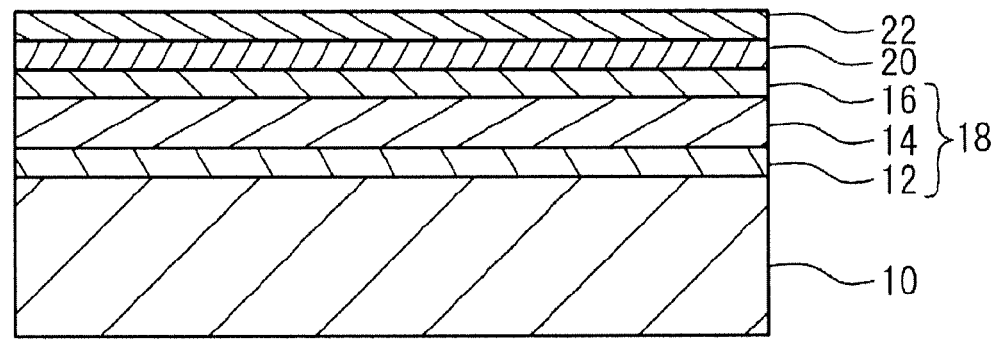
FIG. 10C is a sectional view showing the method of fabricating the semiconductor device according to Example 1.

As shown in FIG. 10C, a GaN cap layer 20 is grown on the nitride semiconductor layer 18. The GaN cap layer 20 is a monocrystalline GaN layer. Examples of growth conditions for the GaN cap layer 20 are as listed below.

Substrate temperature: 1060 degrees Celsius.
Raw material gas: trimethylgallium (TMG), ammonium ($NH_3$)
TMG flow rate: 42 sccm ($7 \times 10^{-7}$ m/s)
$NH_3$ flow rate: 20000 sccm ($3.3 \times 10^{-4}$ m/s)
Carrier gas: hydrogen ($H_2$)
Pressure: 100 Torr (13.3 kPa)
Film thickness: 1 nm to 10 nm The GaN cap layer 20 is grown to suppress oxidation of the electron supply layer 16. It is preferable that, in order to suppress the oxidation, the film thickness of the GaN cap layer 20 be equal to or larger than 1 nm. Triethylgallium (TEG) can be also used as Ga raw material other than TMG.

Figure 10D:
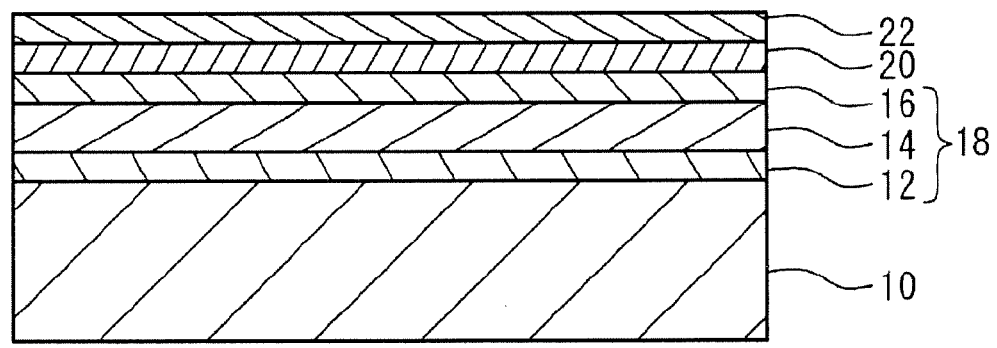
FIG. 10D is a sectional view showing the method of fabricating the semiconductor device according to Example 1.

As shown in FIG. 10D, a GaN compound is grown on the GaN cap layer 20 to form a low-crystallinity gallium nitride layer 22 with low crystallinity. A Ga composition ratio of the low-crystallinity gallium nitride layer 22 is higher than the Ga composition ratio of the GaN cap layer 20. In this embodiment, the atomic composition ratio of [Ga]/[N] in the monocrystalline GaN is substantially equal to one, and the atomic composition ratio of Ga/N in the low-crystallinity gallium nitride layer 22 is larger than one, so that the low-crystallinity gallium nitride layer 22 is amorphous and/or polycrystalline. Examples of growth conditions for the low-crystallinity gallium nitride layer 22 are as listed below.

Substrate temperature: lower than 900 degrees Celsius.
Film thickness: 100 nm or more and 2 μm or less.
Other conditions: same as the conditions for the GaN cap layer 20.

The decomposition temperature of $NH_3$ is about 900 degrees Celsius. Hence, the GaN cap layer 20 is grown at a substrate temperature equal to or higher than 1000 degrees Celsius, so that the GaN cap layer 20 is a monocrystalline layer. On the other hand, the low-crystallinity gallium nitride layer 22 is grown at a substrate temperature lower than 900 degrees Celsius. Specifically, the substrate temperature is preferably equal to or lower than 800 degrees Celsius, and more preferably equal to or lower than 750 degrees Celsius. The substrate temperature is preferably equal to or higher than 600 degrees Celsius so that it is possible to form a Ga-rich gallium nitride compound layer because the supply of N is not markedly reduced.

The steps shown in FIGS. 10B to 10D are sequentially performed without stopping gas supply from the introducing section 52 to be a continuous growth process. For example, the GaN cap layer 20 and the low-crystallinity gallium nitride layer 22 are continuously grown in the growth reactor. The final growth is not the step to grow the GaN cap layer 20 and is the step to grow the low-crystallinity gallium nitride layer 22 of a gallium nitride compound. Consequently, the semiconductor layer 66 is likely to be formed near the introducing section 52 as shown in FIG. 2, and the continuous growth steps can suppress the droplets from dropping from the semiconductor layer 66 onto the nitride semiconductor layer 18 or the GaN cap layer 20, as shown in FIG. 3, during the time after the growth of the nitride semiconductor layer 18 or the GaN cap layer 20 and before the growth of the gallium nitride compound layer.

Figure 11A:
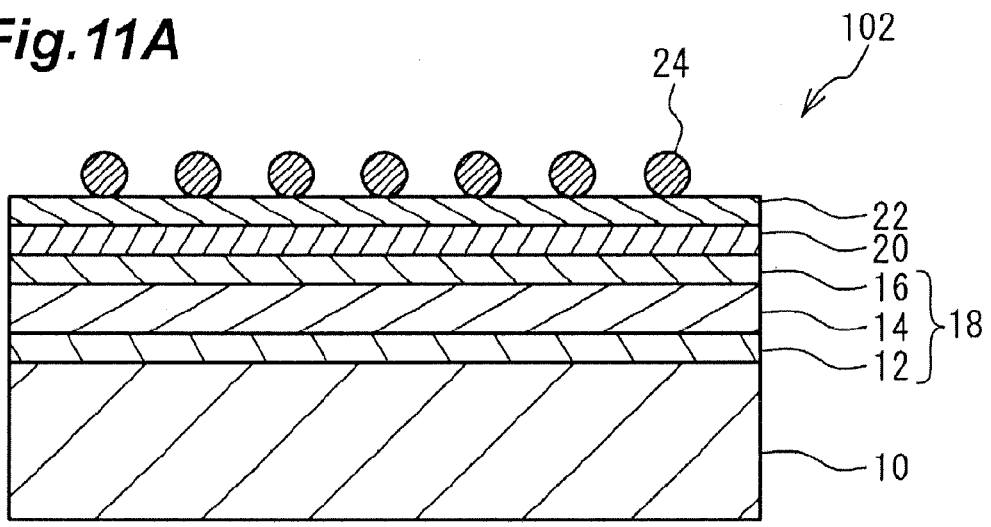
FIG. 11A is a sectional view showing the method of fabricating the semiconductor device according to Example 1.

After the growth in the example is completed, as shown in FIG. 11A, the substrate 10 is extracted from the growth reactor 100. Prior to taking out the substrate 10 from the growth reactor, the gas introduced from the introducing section 52 is stopped, and the stopping of the gas changes a flow of gas in the chamber 50. This gas stop may cause droplets 24 to drop onto the low-crystallinity gallium nitride layer 22 to form a semiconductor substrate 102 (a substrate product or an epitaxial substrate). The semiconductor substrate 102 is stored without change, and then the semiconductor substrate 102 is conveyed to a factory where a subsequent process is applied thereto. In this way, the semiconductor substrate 102 is fabricated and the low-crystallinity gallium nitride layer 22 is formed on the GaN cap layer 20 thereof. This semiconductor substrate 102 allows for the protection (scratches and adhesion of accreting objects or the like can be prevented) of the surface of the GaN cap layer 20.

Figure 11B:
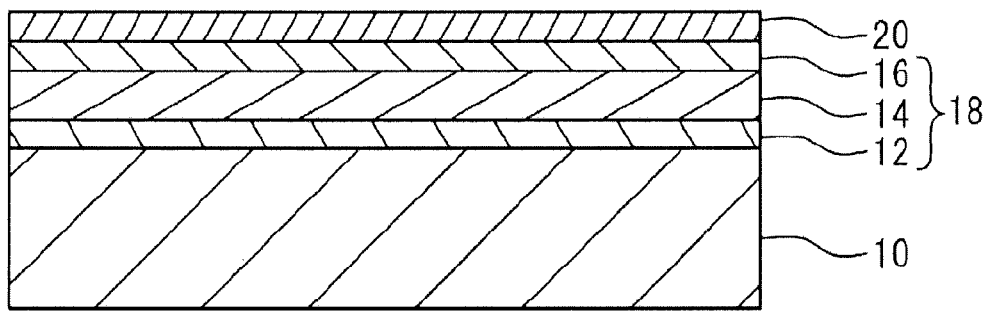
FIG. 11B is a sectional view showing the method of fabricating the semiconductor device according to Example 1.

As shown in FIG. 11B, the droplets 24 and the low-crystallinity gallium nitride layer 22 are removed using the sulfuric acid/hydrogen peroxide mixture. The sulfuric acid/hydrogen peroxide mixture is produced by mixing, for example, 2200 ml of the sulfuric acid (96 volume %) and 440 ml of the hydrogen peroxide. A treatment time for the removal is set to 15 minutes. The droplets 24 and the low-crystallinity gallium nitride layer 22 have composition ratios Ga/N larger than one, and may be amorphous or polycrystalline. For example, the Ga/N of the low-crystallinity gallium nitride layer 22 is sometimes larger than two, sometimes larger than three, and sometimes larger than four. As it is understood from the etching result shown in FIG. 7, the droplets 24 and the low-crystallinity gallium nitride layer 22 are removed by a sulfuric acid-based etching solution. On the other hand, the GaN cap layer 20 is monocrystalline, and the Ga/N of the GaN cap layer 20 is approximately one. As it is understood from the etching result shown in FIG. 8, the GaN cap layer 20 is hardly etched by the sulfuric acid-based etching solution.

Figure 11C:
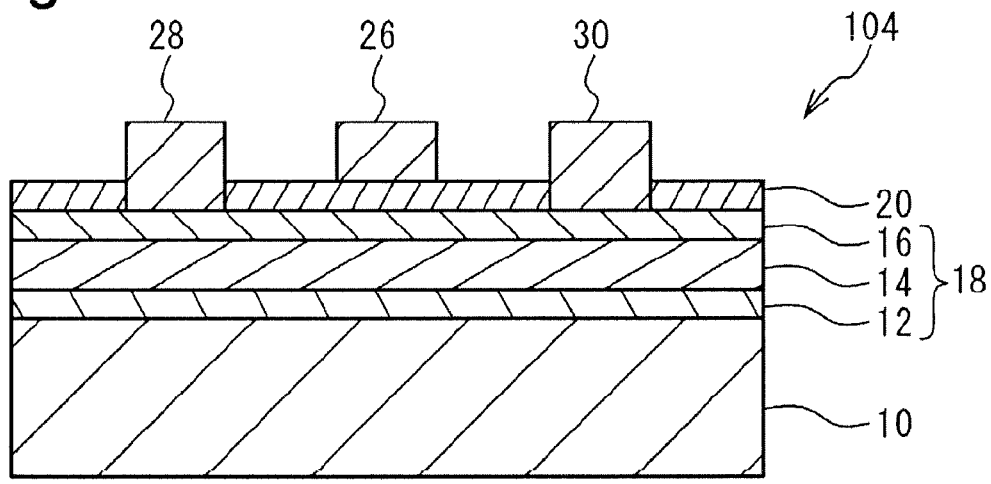
FIG. 11C is a sectional view showing the method of fabricating the semiconductor device according to Example 1.

As shown in FIG. 11C, a gate electrode 26 is formed on the exposed GaN cap layer 20. For example, a nickel (Ni) film and a gold (Au) film are deposited in order on the substrate 10 to form the gate electrode 26 having the laminated layer thereof. A source electrode 28 and a drain electrode 30 are formed on the AlGaN electron supply layer 16, and the gate electrode 26 is located between the source electrode 28 and the drain electrode 30. For example, a titanium (Ti) film and an aluminum (Al) film are deposited in order on the substrate 10 to form the source electrode 28 and the drain electrode 30 each having the laminated layer thereof. A tantalum (Ta) film can be used instead of the Ti film. The GaN cap layer 20 may be etched to form openings such that the source electrode 28 and the drain electrode 30 are in direct contact with the electron supply layer 16. But, the source electrode 28 and the drain electrode 30 may be directly formed on the GaN cap layer 20. After the above steps, a semiconductor device 104 is completed.

Figure 12:
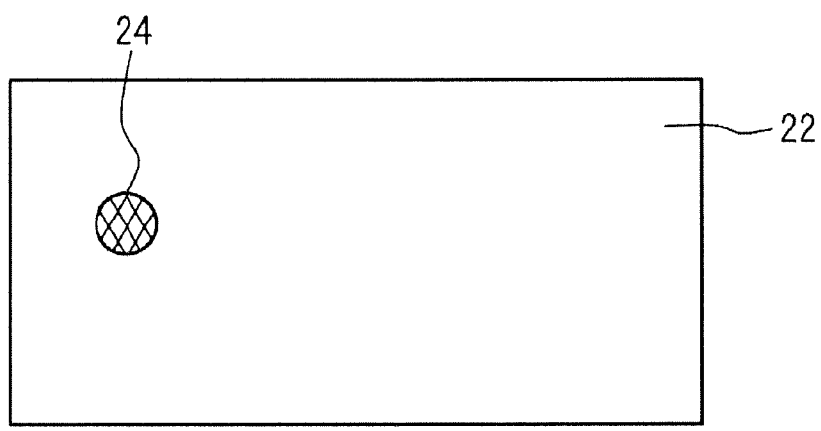
FIG. 12 is a schematic view of an optical microscope image observed after the step shown in FIG. 11A.

FIG. 12 is a top view schematically showing an optical microscope image of an appearance of the article in the step to which the step shown in FIG. 11A has been applied. Referring to FIG. 12, a part is hatched to show the droplet 24 on the low-crystallinity gallium nitride layer 22. This observation reveals that the surface roughness is in the surface of the low-crystallinity gallium nitride layer 22. This indicates that the crystallinity of the low-crystallinity gallium nitride layer 22 is inferior.

Figure 13:
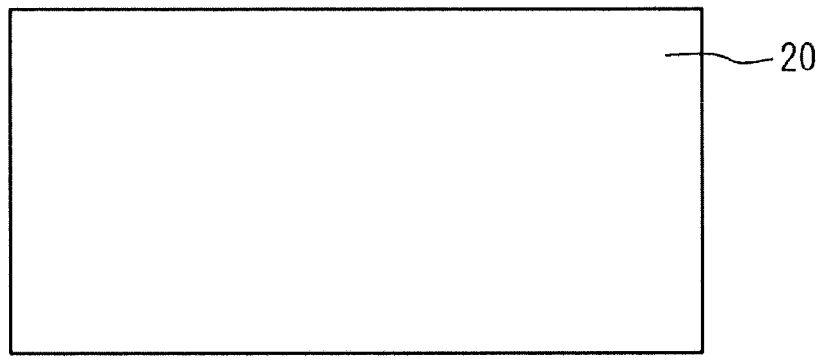
FIG. 13 is a schematic diagram of an optical microscope image observed after the step shown in FIG. 11B.

FIG. 13 is a top view schematically showing an optical microscope image of an appearance of the article in the step after the step shown in FIG. 11B. Referring to FIG. 13, the droplet 24 has been removed together with the low-crystallinity gallium nitride layer 22, and the trace, formed by removing the droplet 24, in FIG. 9 is not observed. Sulfur (S) due to treatment by a drug solution containing S remains on the surface of the GaN cap layer 20 to terminate it.

Figure 14:
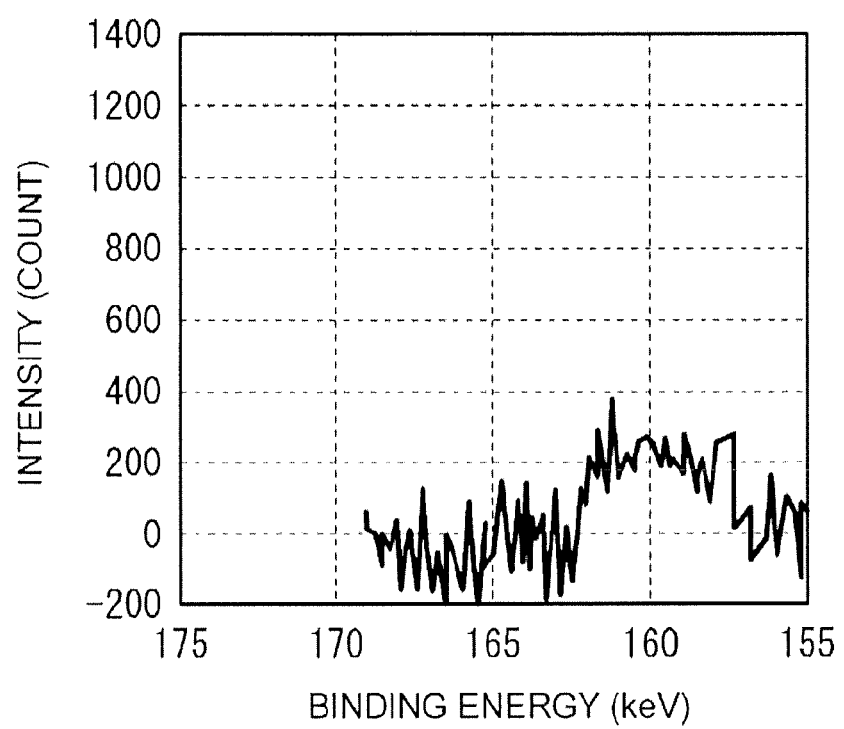
FIG. 14 is an example showing an XPS measurement result on the surface of a GaN layer on which sulfur remains.

FIG. 14 shows an example of an X-ray photoelectron spectroscopy (XPS) measured result of the surface of a GaN layer on which sulfur remains. The abscissa indicates binding energy and the ordinate indicates strength. As shown in FIG. 14, a peak of S2p from Ga—S binding is observed around 160 eV in the spectrum. Unless the treatment the drug solution containing S is applied thereto, the spectrum does not contain the peak of S2p.

In the example 1, as shown in FIG. 10B, the nitride semiconductor layer 18 is formed on the substrate 10. As shown in FIG. 10C, the GaN cap layer 20 (a first GaN layer of single crystal gallium nitride) is grown on the nitride semiconductor layer 18. As shown in FIG. 10D, the amorphous or polycrystalline low-crystallinity gallium nitride layer 22, which has a composition ratio of Ga larger than that of the GaN cap layer 20, of a gallium nitride compound (e.g., a second GaN layer of gallium nitride with a composition ratio of gallium to nitrogen larger than two) is grown on the surface of the GaN cap layer 20 to form an epitaxial substrate. As shown in FIG. 11A, after the substrate 10 is unloaded from the growth reactor, the low-crystallinity gallium nitride layer 22 is removed from the epitaxial substrate to form another epitaxial substrate in which, as shown in FIG. 13, the droplet 24 has been removed. The other epitaxial substrate thus formed does not include the droplet 24 and the trace 70. By making semiconductor devices from the other epitaxial substrate, it is possible to improve the yield of the semiconductor devices.

As a growth condition for the low-crystallinity gallium nitride layer 22, a substrate temperature is set to temperature equal to or lower than a decomposition temperature of a nitrogen material (e.g., $NH_3$). For example, when the low-crystallinity gallium nitride layer 22 is grown using a growth reactor for MOCVD, the substrate temperature is set to be equal to or lower than 800 degrees Celsius, which makes a supply amount of nitrogen smaller than a supply amount of Ga to allow the formation of the low-crystallinity gallium nitride layer 22 having Ga/N larger than one. For example, in the step to form the GaN cap layer 20, the substrate temperature is equal to or higher the decomposition temperature of the nitrogen material. Subsequently, the substrate temperature is reduced to be equal to or lower than the decomposition temperature of the nitrogen material, and the low-crystallinity gallium nitride layer 22 is formed to cover the GaN cap layer 20. In this embodiment, a flow rate of the material gas (i.e., the total flow rate of the source gas and a carrier gas) is kept unchanged, and little change in gas flow occurs in the chamber 50. Droplets are hardly present between the GaN cap layer 20 and the low-crystallinity GaN layer 22.

In another example of growth conditions for the low-crystallinity gallium nitride layer 22, the following condition can also be used: a ratio of the Ga material (the Ga material/the N material) is higher than that in the process for forming the GaN cap layer 20. For example, in the process for forming the low-crystallinity gallium nitride layer 22, a ratio of a TMG gas flow rate/a NH$_3$ gas flow rate is set smaller than that in the step for forming the GaN cap layer 20. This condition allows the thus-formed low-crystallinity gallium nitride layer 22 to have the ratio, [Ga]/[N], of larger than one. In an example for growth in which the substrate temperature is reduced, continuous growth from the GaN cap layer 20 to the low-crystallinity gallium nitride layer 22 may be performed. In an example for growth in which the material ratio is changed, a ratio of the material gas is switched to form an abrupt change in composition at the boundary between the GaN cap layer 20 and the low-crystallinity gallium nitride layer 22. When an overall flow rate of the gas that is introduced into the chamber 50 from the introducing section 52 hardly changes, droplets are hardly formed between the GaN cap layer 20 and the low-crystallinity GaN layer 22. In the formation of the low-crystallinity gallium nitride layer 22, the substrate temperature and the Ga material ratio both may be changed from the substrate temperature and the Ga material ratio for forming the GaN cap layer 20, respectively.

In the example explained with reference to FIG. 11B, the mixed liquid including sulfuric acid and hydrogen peroxide was used to remove the low-crystallinity gallium nitride layer 22. Another drug solution that can remove the low-crystallinity gallium nitride layer 22 and does not etch the GaN cap layer 20 can be also applied thereto. For example, a drug solution obtained by mixing purified water and the mixed liquid of sulfuric acid and hydrogen peroxide may be applied thereto.

When the low-crystallinity gallium nitride layer 22 is removed using the etching liquid including sulfuric acid, sulfur atoms remain on the surface of the GaN cap layer 20. For example, as shown in FIG. 14, a peak of the binding energy is observed around 160 eV in the spectrum obtained by measuring the surface of the GaN cap layer 20 by XPS method.

The growth reactor 100, shown in FIG. 1 in which the introducing section 52 for introducing gas is provided above the wafer 60, is likely to easily form droplets. Therefore, it is preferable to apply the method in the example 1 thereto. Besides growth reactors for MOCVD, the growth reactor 100 may be a hydride vapor phase epitaxy (HVPE) apparatus, a liquid phase epitaxy (LPE) apparatus, or a molecular beam epitaxy (MBE) apparatus.

The GaN cap layer 20 has a function of suppressing oxidation of the nitride semiconductor layer 18. To suppress oxidation of the nitride semiconductor layer 18, the film thickness of the GaN cap layer 20 is preferably equal to or larger than 1 nm and more preferably equal to or larger than 2 nm. When a trace with a depth equal to or smaller than 100 nm as shown in FIG. 9 remains, the GaN cap layer 20 thicker in thickness does not affect the nitride semiconductor layer 18. Accordingly, the film thickness of the GaN cap layer 20 is preferably equal to or smaller than 100 nm. The film thickness of the GaN cap layer 20 is preferably equal to or smaller than 10 nm and more preferably equal to or smaller than 5 nm. This results in that the distance between the gate electrode 26 and the electron supply layer 16 is made small to improve the performance of the semiconductor device 104.

In order not to leave a trace with the depth of about 100 nm, the film thickness of the low-crystallinity gallium nitride layer 22 is preferably equal to or larger than 100 nm and more preferably equal to or larger than 200 nm. To suppress a crack due to film stress, the film thickness of the low-crystallinity gallium nitride layer 22 is preferably equal to or smaller than 2 μm and more preferably equal to or smaller than 1 μm.

In the above embodiment, the HEMT is explained as an example of the semiconductor device. However, the above embodiment of the semiconductor device can be applied to other semiconductor devices. The nitride semiconductor layer 18 can comprise, for example, GaN, InN, AN, InGaN, AlGaN, InAlN, and InAlGaN. In the nitride semiconductor layer 18, the GaN cap layer 20, and the low-crystallinity gallium nitride layer, other components may be included as long as the effects of the present invention are obtained.

The above embodiments can be provided to reduce the number of accreting objects or particles, comprising gallium, which adhere onto a semiconductor layer.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method for making an epitaxial substrate, comprising:
   a step of growing a first layer on a substrate in a growth reactor, the first layer being made of one of gallium nitride (GaN), aluminum gallium nitride (AlGaN) and indium aluminum nitride (InAlN);
   a step of growing a second layer made of gallium nitride compound on a surface of the first layer continuously in the growth reactor, the second layer being in contact with the first layer, and the gallium nitride compound of the second layer having a composition ratio of gallium to nitrogen larger than 2;
   a step of taking the substrate out of the growth reactor after the step of growing the second layer; and
   a step of exposing the first layer by etching the second layer after the step of taking the substrate out of the growth reactor;
   wherein the step of growing the second layer accompanies with an accreting particle of gallium on the second layer after the step of growing the second layer, and
   wherein the step of exposing the first layer removes the accreting particle of gallium on the second layer.

2. The method according to claim 1,
   wherein the step of growing the second layer on the surface of the first layer uses a material organic chemical vapor deposition (MOCVD) reactor as the growth reactor at a temperature of the substrate equal to or lower than 800 degrees Celsius.

3. The method according to claim 1,
   wherein the etching of the second layer uses a mixed liquid containing sulfuric acid and hydrogen peroxide.

4. The method according to claim 1,
   wherein the growth reactor includes an introducing port above the substrate, the introducing port introducing gas into the growth reactor therethrough.

* * * * *